(12) United States Patent
Adams et al.

(10) Patent No.: US 6,353,903 B1
(45) Date of Patent: *__Mar. 5, 2002__

(54) METHOD AND APPARATUS FOR TESTING DIFFERENTIAL SIGNALS

(75) Inventors: Robert Dean Adams, Essex Junction; John Connor, Burlington; Donald Albert Evans, Williston; Luigi Ternullo, Jr., Colchester, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/330,768

(22) Filed: Oct. 28, 1994

(51) Int. Cl.[7] ................................................. G01R 31/28
(52) U.S. Cl. ........................................ 714/724; 714/733
(58) Field of Search ............................. 307/291, 272 R; 377/70; 365/73, 201; 371/22.1, 21.3; 714/724, 727, 733, 735, 742, 25, 30, 32, 37

(56) References Cited

U.S. PATENT DOCUMENTS

| 4,181,881 A | | 1/1980 | Preikschat ................. 324/57 R |
|---|---|---|---|
| 4,503,387 A | | 3/1985 | Rutledge et al. ........... 324/73 R |
| 4,631,425 A | * | 12/1986 | Koshimaru .................. 307/449 |
| 4,638,183 A | * | 1/1987 | Rickard et al. ............. 307/291 |
| 4,695,743 A | * | 9/1987 | Des Brisay, Jr. ......... 307/272.2 |
| 4,698,830 A | | 10/1987 | Barzilai et al. ................ 377/19 |
| 5,022,007 A | * | 6/1991 | Arimoto et al. ............ 365/201 |
| 5,068,881 A | * | 11/1991 | Dervisoglu et al. ........... 377/70 |
| 5,119,378 A | | 6/1992 | Welles, II et al. ......... 371/22.5 |
| 5,173,906 A | | 12/1992 | Dreibelbis et al. ......... 371/22.5 |
| 5,199,034 A | | 3/1993 | Yeo et al. .................. 371/21.2 |
| 5,287,386 A | | 2/1994 | Wade et al. .................. 375/36 |
| 5,301,156 A | | 4/1994 | Talley ........................ 365/201 |

* cited by examiner

*Primary Examiner*—Nadeem Iqbal
(74) *Attorney, Agent, or Firm*—Heslin & Rothenburg, PC; Eugene I. Shkurko; Mark F. Chadurjian

(57) ABSTRACT

True and complement data signals are provided to a multiplexer, which selects one of them based on a selection signal for capture by a single scannable latch in response to a clock signal. The scannable latch then provides the captured signal for testing by testing logic.

11 Claims, 3 Drawing Sheets

METHOD AND APPARATUS FOR TESTING DIFFERENTIAL SIGNALS

BACKGROUND OF THE INVENTION

1. Technical Field

The present invention generally relates to the testing of differential signals. More particularly, the present invention relates to capturing and providing a true signal and its complement for testing thereof.

2. Background Art

The performance demands on dynamic circuits has led to the use of both true and complement signals, both in the data path and in the testing path. For example, memory chips have been designed requiring not only the actual addresses in the memory array, but also the complement of a given address. In addition, some memory chips also provide true and complement output data to provide a faster interface to attached logic at the array output.

While the need for true/complement signal pairs has increased, testing thereof has largely remained focused on only the true signal and not the complement signal. In the past, testing schemes have focused on generating a complement of the true signal, rather than testing the actual complement, for example, using a latch. However, this type of design ignores the possibility that the actual complement signal may not have the correct signature (i.e., may not be the actual complement of the true signal or may not be the expected signal even if it is the complement of the true signal), or that there may be a physical problem with the complement signal path.

One proposed solution to this problem can be found in U.S. Pat. No. 4,698,830, issued to Barzilai et al. and assigned to IBM. FIG. 4 of the Barzilai patent depicts data and minus data signals entering testing logic 36, the purpose of which is to ensure that the data and minus data signals have the correct signature prior to testing. However, logic block 36 contains several logic elements occupying valuable real estate and may be more complex than is necessary to ensure that both the data and minus data signals are able to be tested. A deceptively simple solution to the problem of testing both the true and complement signals is to provide one latch for each signal that could be clocked at different times to provide the signals to the testing logic. However, a latch is a relatively large component and occupies much valuable chip real estate, which explains the use of a single latch both to pass the true signal and to generate a complement signal therefor to the testing logic.

Thus, a need exists for a less complex way to provide a true signal and its complement for testing while minimizing the amount of valuable chip real estate dedicated thereto.

SUMMARY OF THE INVENTION

Briefly, the present invention satisfies the need for a less complex way to provide true/complement pairs for testing without using an excess of valuable chip real estate by multiplexing the true and complement signals for capturing by a latch and providing to testing logic.

In accordance with the above, it is an object of the present invention to provide increased test coverage of differential signals.

It is another object of the present invention to provide both a true signal and a real complement signal for testing.

It is a further object of the present invention to sequentially provide a true signal and its complement for testing.

The present invention provides, in a first aspect, a test circuit, comprising a means for selecting a test signal from among a true signal and a complement signal, and a means for capturing the test signal for testing. The test circuit may further comprise a means for providing the test signal for testing. The selecting means may comprise a true signal line, a complement signal line and a multiplexer for providing the test signal to the capturing means in response to a select signal. The capturing means may comprise a latch. The providing means may also comprise a latch.

The present invention provides, in a second aspect, a method for testing differential signals. The method comprises steps of providing a true signal and a complement signal and selecting a test signal for testing from among the true and complement signals. The method may also include steps of capturing the test signal and providing same for testing. The step of selecting may comprise sequentially selecting the test signal from among the true and complement signals.

These, and other objects, features and advantages of this invention will become apparent from the following detailed description of the various aspects of the invention taken in conjunction with the accompanying drawings.

BEST MODE FOR CARRYING OUT THE INVENTION

In the past, performance requirements only dictated the need for single ended static or dynamic inputs (i.e., only a true signal and not its complement). However, the drive for dynamic circuits to perform their intended function with ever-increasing speed has resulted in the need for both true and complement signals. True and complement (T/C) signal pairs allow for improved performance, for example, in memory chips through early decode and a faster interface to attached logic at array outputs. Although there has been a need for T/C signal pairs for some time, signal testing has failed to keep pace with technology changes from performance demands.

Figure 1:
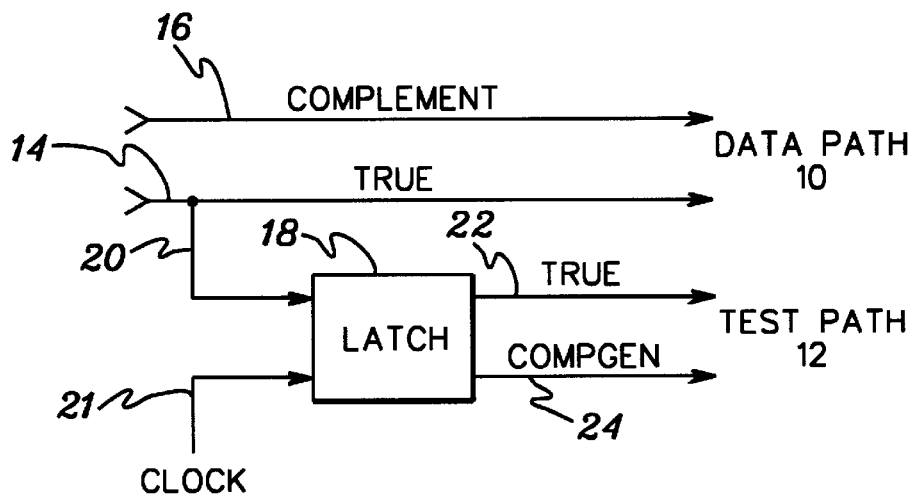
FIG. 1 depicts prior art circuitry for providing true and complement signals for testing.

FIG. 1 depicts a prior art data path 10 and test path 12. Data path 10 comprises true data signal line 14 and complement data signal line 16. The true signal is fed to latch 18 over line 20 for capturing in response to a clock signal over line 21 for test purposes. Latch 18 passes the true signal over line 22 along test path 12, and generates a complement signal "COMPGEN" for testing on line 24. This arrangement assumes that the complement signal on line 16 will always be the actual complement of the true signal on line 14 and that there is no physical problem on line 16. However, this may not always be the case. For any number of reasons, the complement signal on line 16 may not be what is intended, or there may be a physical problem with line 16. For example, the complement signal may be experiencing a "stuck-at" error.

Figure 2:
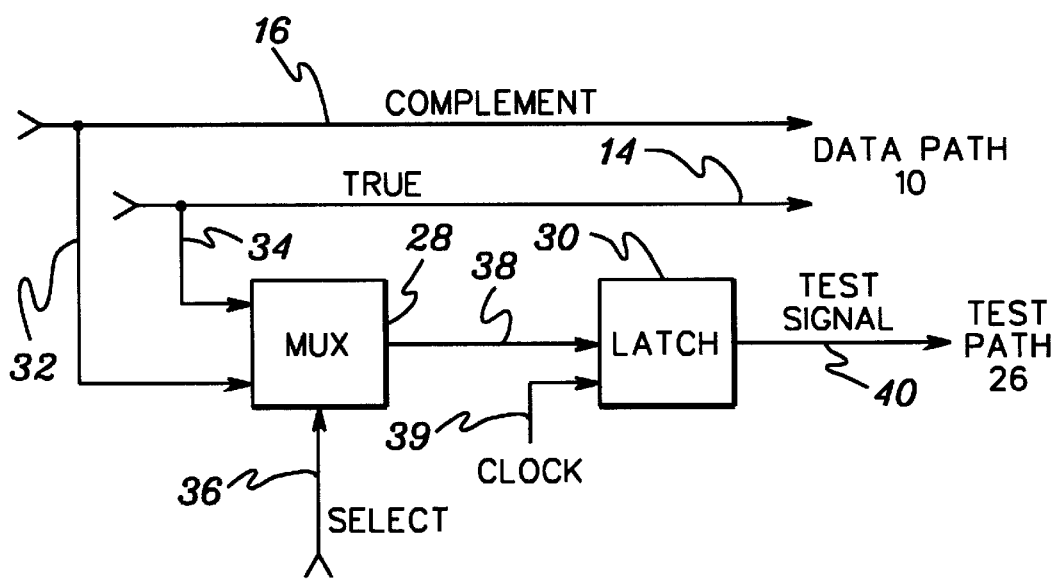
FIG. 2 depicts circuitry according to the present invention for providing true and complement signals for testing.

FIG. 2 depicts a simple embodiment of the present invention according to a first aspect. Included in FIG. 2 is data path 10, complement line 16 and true line 14 of FIG. 1. Placed in test path 26 of FIG. 2 are multiplexer 28 and latch 30. The inputs to multiplexer 28 are the complement signal over line 32 and the true signal over line 34. A select signal on line 36 causes multiplexer 28 to select one of the complement and true signals for providing to latch 30 on line 38. Latch 30 captures the signal selected by multiplexer 28 in response to a clock signal provided on line 39 for providing to test path 26 over line 40. The simplified embodiment of FIG. 2 emphasizes that the present invention seeks to ensure that the complement signal, as well as the true signal, are available for testing. Since data path 10 and test path 26 are separated, performance is dependent only on the speed of data path 10 and not test path 26. Thus, the addition of multiplexer 28 along test path 26 does not affect performance. Also, as compared to the addition of a second latch for the complement signal, multiplexer 28 requires about 85% less valuable chip real estate. In addition, unlike FIG. 1, the arrangement in FIG. 2 allows full differential test coverage of both the true and complement signals.

Figure 3:
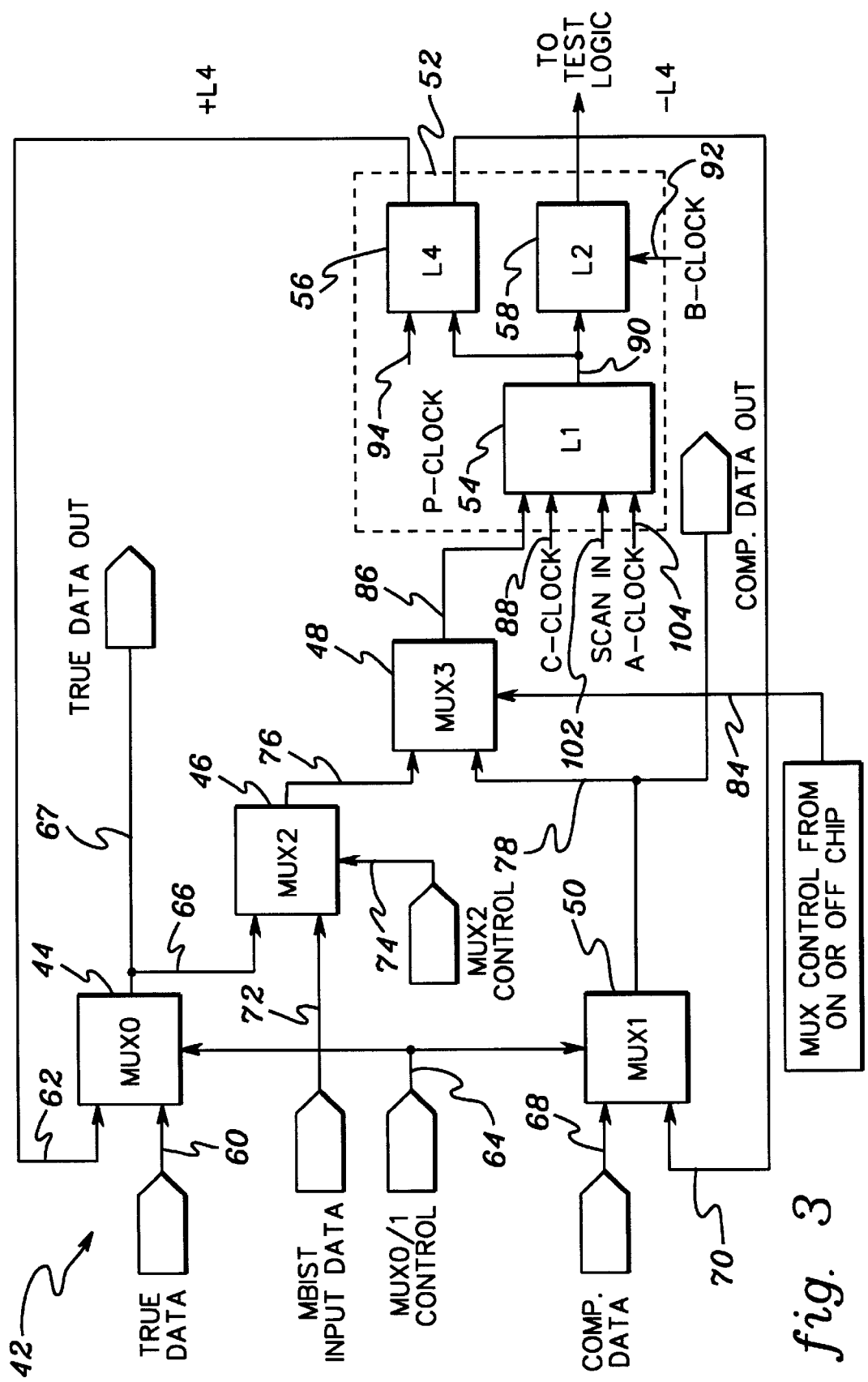
FIG. 3 depicts a memory chip subcircuit for LSSD and MBIST testing of true and complement signals.

FIG. 3 depicts an implementation of the present invention in an SRAM memory chip utilizing both LSSD testing (Level Sensitive Scan Design) and MBIST testing (Memory Built-In Self Test). One skilled in the art will be familiar with these types of testing. FIG. 3 depicts subcircuit 42 comprising multiplexers 44, 46, 48 and 50, as well as scannable latch 52, which comprises capture latch 54, feedback latch 56 and scan out latch 58. The operation of subcircuit 42 will now be described in detail. The inputs to multiplexer 44 are a true data signal over line 60 and the true output of feedback latch 56 over line 62. Based on a select signal supplied to multiplexer 44 over line 64, multiplexer 44 selects one of the true data signal over line 60 and the true output of latch 56 over line 62 for supplying to multiplexer 46 over line 66. The output of multiplexer 44 is also sent to a memory array (not shown) over line 67. The select signal supplied to multiplexer 44 over line 64 causes selection of the true data signal over line 60 when in LSSD testing mode, and the true output of latch 56 over line 62 when in MBIST testing mode. Similarly, the inputs to multiplexer 50 are the complement data signal over line 68 and the complement signal out of latch 56 over line 70. The select signal supplied to multiplexer 44 is also supplied to multiplexer 50, causing selection of the complementary data signal over line 68 when in LSSD testing mode, and the complementary output of latch 56 over line 70 when in MBIST testing mode. Along with the output of multiplexer 44 over line 66, the input to multiplexer 46 includes MBIST input data over line 72. The MBIST input data is provided by an MBIST state machine (not shown), which may also provide the select signal for multiplexer 46 during MBIST testing mode. A select signal to multiplexer 46 over line 74 causes multiplexer 46 to select the output of multiplexer 44 when in LSSD testing mode, and the MBIST input data when in MBIST testing mode. The output of multiplexer 46 on line 76 and the output of multiplexer 50 on line 78 act as the inputs to multiplexer 48. Similarly, the output of multiplexer 50 is also supplied to the array over line 82. Based on a select signal supplied to multiplexer 48 over line 84, originating from on or off the chip including subcircuit 42, multiplexer 48 selects one of the output of multiplexer 46 and the output of multiplexer 50 for supplying to scannable latch 52 over line 86.

The output of multiplexer 48 is clocked into capture latch 54 by a clock signal over line 88. Capture latch 54 passes the captured output of multiplexer 48 to feedback latch 56 and scan out latch 58 over line 90. Scan out latch 58 receives the output of capture latch 54 during LSSD testing mode when clocked over line 92. Feedback latch 56 receives the captured signal from latch 54 when clocked over line 94, generates its complement and supplies both to multiplexers 44 and 50 over lines 62 and 70, respectively, during MBIST testing mode. Although FIG. 3 shows the output of latch 58 going to test logic, it may be the case that prior to reaching the test logic, the output cascades through several other scannable latches. This cascading is accomplished by a capture latch, such as latch 54, accepting the cascaded signal over line 102 based on a clock signal over line 104. From subcircuit 42, one can appreciate that multiplexer 48, in general, allows either a true signal or its complement to be selected for testing, whether that testing be LSSD, MBIST or some other testing method. One can further appreciate the simplicity of a single latch, in this case a single scannable latch. It will be understood that although scannable latch 52 has been described as including latches 56 and 58, the term "scannable latch" includes a design with only a capture latch and a second latch which serves the purposes of both latch 56 and latch 58. However, such a second latch would include an OR gate having inputs of an MBIST mode clock signal and an LSSD mode clock signal.

Figure 4:
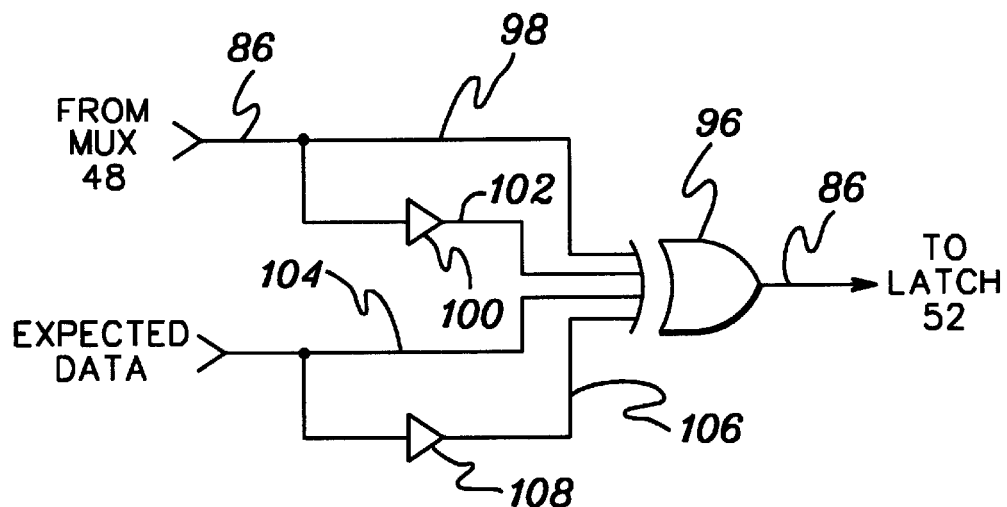
FIG. 4 depicts optional test logic for the memory chip subcircuit of FIG. 3

Although the test logic has been presented in FIG. 3 as following scannable latch 52, it may be the case that some of the testing logic is placed between multiplexer 48 and latch 52. One example of this is depicted in FIG. 4. Shown there is an exclusive-OR gate 96 for determining whether the output of multiplexer 48 is as expected during MBIST testing; that is, whether the data coming out of the memory array is as expected. The process of making this determination is referred to as "compression". The inputs to exclusive-OR gate 96 include the output of multiplexer 48 over line 98, which is inverted by inverter 100 and supplied to gate 96 over line 102. The inputs to gate 96 also include an "EXPECTED DATA" signal over line 104 and its complement over line 106 created by inverter 108. The logic of FIG. 4 serves to emphasize that there need not be a direct connection between multiplexer 48 and scannable latch 52 to come within the scope of the present invention.

Figure 5:
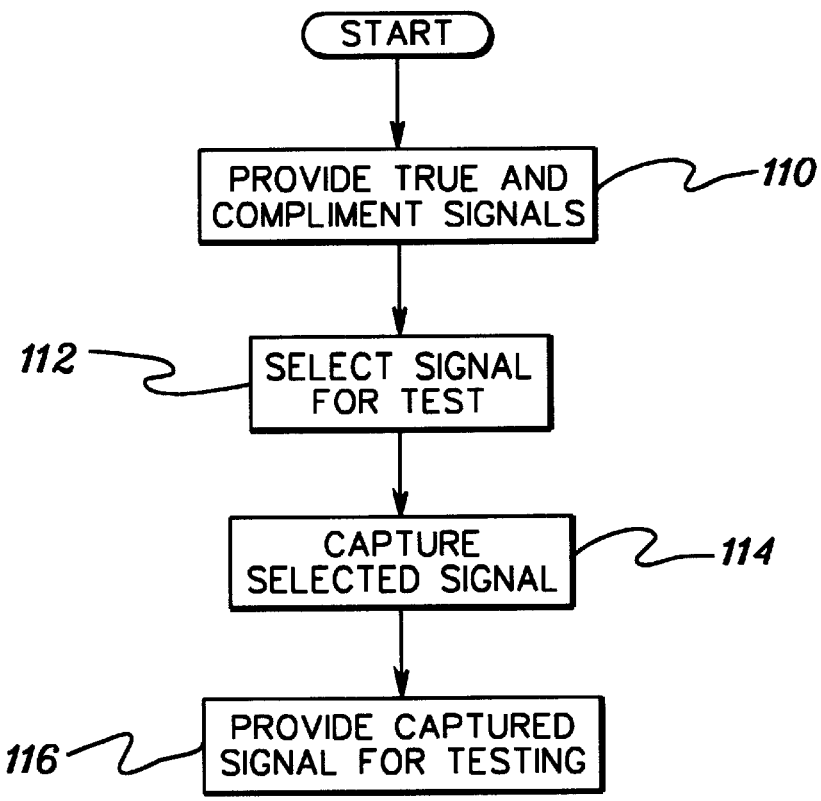
FIG. 5 is a flow diagram of a method for testing differential signals according to the present invention.

In a second aspect of the present invention, a method is provided for testing differential signals; that is, a true signal and its complement. FIG. 5 is a flow diagram of the method of the second aspect. The method will now be described with reference to FIG. 3. The method begins by providing true and complement signals (STEP 110, "PROVIDE TRUE AND COMPLEMENT SIGNALS"). With respect to FIG. 3, Step 110 is performed by providing a true signal to multiplexer 48 over line 76 and providing a complement signal to multiplexer 48 over line 78. The second step in the method is to select a signal for testing from among the true signal and complement signal (STEP 112, "SELECT SIGNAL FOR TEST"). With respect to FIG. 3, Step 112 is performed by multiplexer 48 in response to a select signal over line 84, causing multiplexer 48 to select either the true signal over line 76 or the complement signal over line 78. Preferably, multiplexer 48 selects one of the signals for testing, and then selects the other signal for testing, thereby sequentially selecting the test signal from among the true and complement signals. After a signal is selected for testing, the selected signal is captured for providing to the testing logic (STEP 114, "CAPTURE SELECTED SIGNAL"). With respect to FIG. 3, Step 100 is performed generally by scannable latch 52, and specifically by capture latch 54 in response to a clock signal over line 88. In the embodiment of FIG. 3, there is another step of providing the captured signal for testing (STEP 116, PROVIDE CAPTURED SIGNAL FOR TESTING). In LSSD testing mode, this is accomplished by scan out latch 58 in response to a clock signal on line 92. In MBIST testing mode, this is accomplished by feedback latch 56 in conjunction with multiplexers 44 and 50. In response to a clock signal on line 94, latch 56 provides the signal received from latch 54 and its locally generated complement to multiplexers 44 and 50. In response to a control signal on line 64 indicating MBIST testing mode, the signals from latch 56 on lines 62 and 70 are selected for sending to the memory array (not shown) over lines 67 and 82, respectively. Although the method of the second aspect has been described with respect to FIG. 3, it will be understood that the method could be practiced with circuitry different from that depicted in FIG. 3.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A test circuit comprising:
   a multiplexer having a first input coupled to an upstream logic device for receiving true data signals generated by the logic device and having a second input coupled to the logic device for receiving complement data signals of the true data signals, said complement data signals also generated by the logic device, wherein neither said true nor said complement data signals are locally generated, and wherein the multiplexer selects either a true data signal from the first input or a complement data signal from the second input; and
   a latch coupled to the multiplexer for capturing said selected data signal for testing.

2. A test circuit for testing data in a data path comprising:
   a true signal line for propagating a true data signal generated by a logic device;
   a complement signal line for propagating a complement data signal of the true data signal, the complement data signal also generated by said logic device;
   a latch for capturing a test signal; and
   a multiplexer coupled to:
      said true signal line;
      said complement signal line; and
      said latch,
   wherein said multiplexer provides one of said true data signal and said complement data signal to said latch as said test signal in response to a select signal, and wherein said logic device is not physically adjacent said multiplexer.

3. The test circuit of claim 2 wherein said latch comprises an output for providing said test signal for testing in response to a clock signal.

4. The test circuit of claim 3 wherein said latch further comprises a scannable latch including a first latch for capturing said test signal and a second latch coupled to said first latch for providing said captured test signal for testing.

5. The test circuit of claim 4 wherein said scannable latch further includes a third latch coupled to said first latch for generating a complement signal of said captured test signal and providing both said captured test signal and said complement signal for testing.

6. A method for testing a true/complement differential signal pair from a differential data path, comprising the steps of:
   a single logic device generating and providing to a first input of a multiplexer a true data signal via said differential data path;
   said single logic device generating and providing to a second input of the multiplexer a complement data signal of said true data signal via said differential data path, said first and second inputs being provided to said multiplexer at the same time; and
   selecting a test signal for said testing from among said true data signal and said complement data signal comprising providing a select signal to said multiplexer.

7. The method of claim 6 further comprising steps of: capturing said test signal; and providing said captured test signal for said testing.

8. The method of claim 6 wherein said step of selecting further comprises sequentially selecting said test signal from among said true data signal and said complement data signal.

9. The method of claim 7 wherein said step of capturing comprises capturing said test signal in a latch and wherein said step of providing comprises providing said test signal via said latch.

10. The method of claim 7 wherein said step of capturing comprises capturing said test signal in a first latch and wherein said step of providing comprises providing said test signal via a second latch.

11. The method of claim 10 wherein said first latch and said second latch comprise a scannable latch.

* * * * *